United States Patent [19]

Miskin

[11] Patent Number: 4,804,895
[45] Date of Patent: Feb. 14, 1989

[54] CHARGE BALANCING CURRENT SAMPLER FOR A DIGITAL MOTOR CONTROL

[75] Inventor: John D. Miskin, Milton Keynes, England

[73] Assignee: Allen-Bradley Company, Inc., Milwaukee, Wis.

[21] Appl. No.: 81,467

[22] Filed: Aug. 4, 1987

[51] Int. Cl.⁴ ............................................. H02P 7/285
[52] U.S. Cl. ............................. 318/345 A; 318/345 E; 318/317
[58] Field of Search ................................ 318/308–317, 318/561, 569, 600–601, 345; 364/162, 167–168, 138–139, 148–149, 829

[56] References Cited

U.S. PATENT DOCUMENTS

| 3,955,130 | 5/1976 | Graf | 318/341 |
| 4,165,476 | 8/1979 | Weiser | 318/375 |
| 4,361,831 | 11/1982 | Grützdiek et al. | 364/829 |
| 4,546,424 | 10/1985 | Nolan | 363/87 |
| 4,549,122 | 10/1985 | Berkopec et al. | 318/338 |
| 4,553,187 | 11/1985 | Burns et al. | 361/918 |
| 4,684,856 | 8/1987 | Kahkipuro | 318/327 |
| 4,716,535 | 12/1987 | Yoshida et al. | 318/317 |

Primary Examiner—William M. Shoop, Jr.
Assistant Examiner—David Martin
Attorney, Agent, or Firm—Quarles & Brady

[57] ABSTRACT

An analog current sensing circuit is controlled by a current loop microprocessor. An integrator circuit stores charge which is the integral of armature current in a motor. The output is read by the microprocessor and divided by a time value to determine an average value of current. The microprocessor generates a pulse to discharge a capacitor in the integrator circuit to the same extent it was charged by a current feedback signal. At the same time the circuit may be sensing current for the next cycle. Leftover fractions of pulses are stored as charge on the capacitor and are included in values sensed in succeeding cycles. Both a method and a circuit are disclosed.

14 Claims, 3 Drawing Sheets

CHARGE BALANCING CURRENT SAMPLER FOR A DIGITAL MOTOR CONTROL

BACKGROUND OF THE INVENTION

1. Field of the Invention

The field of the invention is electronic controls for controlling electrical equipment, such as electric motors, where an electrical current is sensed and then compared to a current command to arrive at a resulting signal to be applied to the motor. The invention may also have application to other types of controls in which current sensing is important.

2. Background Art

An example of an electronic control for a DC motor is shown and described in Berkopec et al., U. S. Pat. No. 4,549,122, issued Oct. 25, 1985. A basic function of the control is to regulate armature current by sensing the actual current fed to the armature and by determining the difference between this signal and a current command signal. The difference between these two signals becomes an error signal that is applied to the motor through an armature current regulating amplifier to reduce the error or difference between the two signals.

Current sensing in this type of motor control has typically been accomplished with some type of analog circuitry. The application of digital microprocessors to this type of motor control has offered advantages in fast response time in executing motor control loops. The use of such digital circuits, however, requires new digital techniques for sensing the voltages and currents present in electrical motors.

SUMMARY OF THE INVENTION

The invention relates to digital control of an analog sensing circuit in a current loop controller portion of a larger motor controller.

According to a method of the invention a signal proportional to a current being supplied to an electrical device is fed back to an integrator circuit that generates an analog output signal. The analog output signal is sensed over a sample time period and converted to a digital value. An average value of the current being supplied to the electrical device is calculated by dividing the digital value by the sample time period.

The integrator circuit is reset in response to the digital value by generating a reset signal that is proportional to the digital value, and by generating the reset signal for a time period necessary to discharge the integrator circuit by an equal amount to which it was charged to generate the analog output signal.

By repeating this sequence over several cycles, a fraction of the analog output signal that is not sensed during one cycle, due to the resolution of the A-to-D conversion, can be picked up in later cycles.

A circuit according to the invention includes: (1) an integrator circuit having an input for receiving a feedback signal that is proportional to the current being supplied to the electrical device, and also having an output; (2) circuitry for sensing an analog signal for a sample time period at the output of the integrator circuit and converting it to a digital current value; (3) circuitry for calculating the average value of the current supplied to the electrical device by dividing the digital value by the sampling time period; (4) circuitry for controlling the resetting of the integrator circuit by controlling application of a reset signal to the input of the integrator circuit for a time period necessary to discharge the integrator circuit by an equal amount to which it was charged to generate the analog signal; and (5) circuitry for operating the above-mentioned circuitry for successive cycles, thereby sensing a fraction of the analog output signal that is not sensed during a first cycle due to the resolution of the conversion of the analog output signal to a digital value.

One object of the invention is to provide a method of current sensing for a processor-based motor control which does not require extensive programming and which maintains the accuracy of the resulting current values.

Another object of the invention is to provide a circuit for improving the resolution of current sensing by a digital microprocessor.

Another object of the invention is to provide an analog sensing circuit that can be controlled by a programmed microprocessor to provide an accurate value of current being supplied to a motor or other electrical device.

These and other objects and advantages of the invention will become apparent from the following description in which reference is made to the accompanying drawings and to the appendix, which form a part hereof, and in which there is illustrated by way of example, a preferred embodiment of the invention. This example does not necessarily represent the full scope of the invention, however, and reference is made to the claims that follow the description for determining the various embodiments that come within the scope of the invention.

DETAILED DESCRIPTION OF THE PREFERRED EMBODIMENTS

Figure 1:
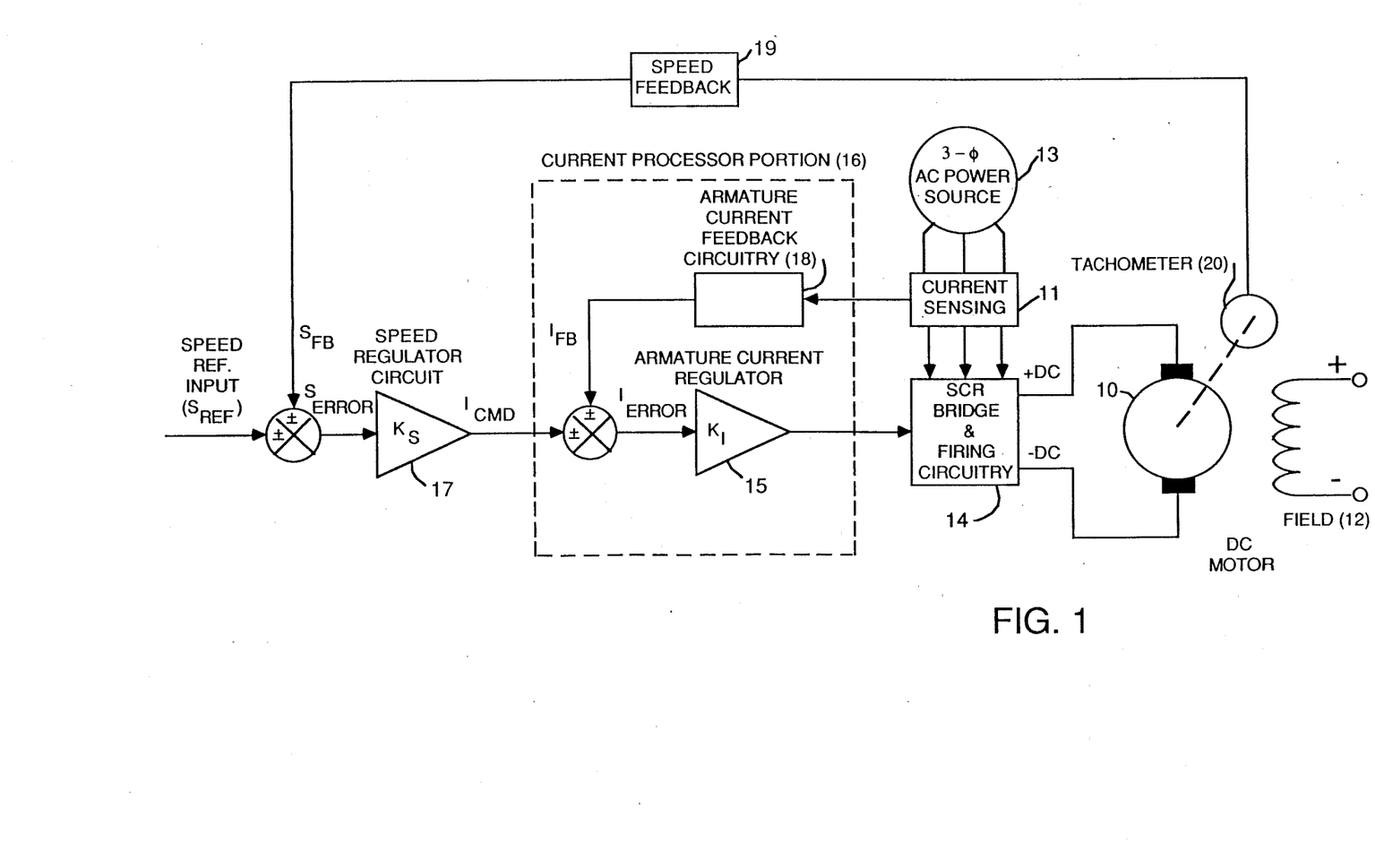
FIG. 1 is a system block diagram for an electronic control for a DC motor that incorporates the present invention.

Referring to FIG. 1, the invention is illustrated in the context of an electronic control for a DC motor that is referred to by those skilled in the art as a DC motor "drive". The drive is connected through +DC and −DC lines to the armature 10 of a DC motor. The motor also includes a field winding 12 for generating an electromagnetic field in the motor. Although it is not essential to a description of the invention, it should be understood that the drive includes circuitry for controlling current supplied to the field winding 12 and circuitry suitable for this purpose is known to those skilled in the art.

The present invention concerns the circuitry for controlling electrical signals to the armature 10. A 3-phase AC power source 13 is connected through a current sensing device 11 to supply power to an SCR bridge and firing circuitry indicated generally by element 14. This element 14 should be understood to include not only a 3-phase SCR bridge for AC-to-DC power conversion but also SCR firing control circuitry, and where desired, a group of pulse transformers connecting the firing control circuitry to the 3-phase SCR bridge as described in Berkopec et al., U. S. Pat. No. 4,549,122.

The SCR firing circuitry 14 responds to an armature current error signal ($I_{ERROR}$) from an armature current regulator 15 to select a phase angle at which the SCR's in the bridge network are fired. This allows for control of both the magnitude and polarity of the DC current which is supplied to the armature 10.

A current processor portion 16 of the drive executes a current regulation loop by sensing a current feedback signal ($I_{FB}$) and algebraically summing it with a current command signal ($I_{CMD}$) received from a speed regulator circuit 17 to generate the current error signal. Besides some type of sensing device 11 in the AC supply lines, such as current transformers or a Hall device, a motor drive will typically include some additional current sensing circuitry 18 for converting the current feedback signal to a level and polarity suitable for processing in the current processor, and this circuitry is represented generally by element 18 in FIG. 1. The armature current regulator 15 includes an amplifier which multiplies the error by a gain factor $K_I$. The armature current regulator 15 typically includes both a proportional gain circuit and an integral circuit, so that the gain factor includes both proportional and integral gain factors.

A velocity loop portion of the drive includes speed feedback circuitry 19, which is connected to receive a speed feedback signal from a tachometer 20 coupled to a rotating output shaft on the armature 10. The speed feedback circuitry 19 converts the speed feedback signal from the tachometer 20 to a signal of the appropriate range and polarity for processing by the other velocity loop circuitry This circuitry executes a speed regulation loop by sensing a speed feedback signal ($S_{FB}$) received from the speed feedback circuitry 19 and algebraically summing it with a speed command signal ($S_{REF}$)—usually generated by a human operator through a manual control device—to generate a speed error signal which is also the current command signal ($I_{CMD}$). The speed regulator circuit 17 includes an amplifier which multiplies the speed error by a gain factor $K_S$. The speed regulator circuit 17 may also include both a proportional gain circuit and an integral circuit, so that the gain factor includes both proportional and integral gain factors.

Figure 2:
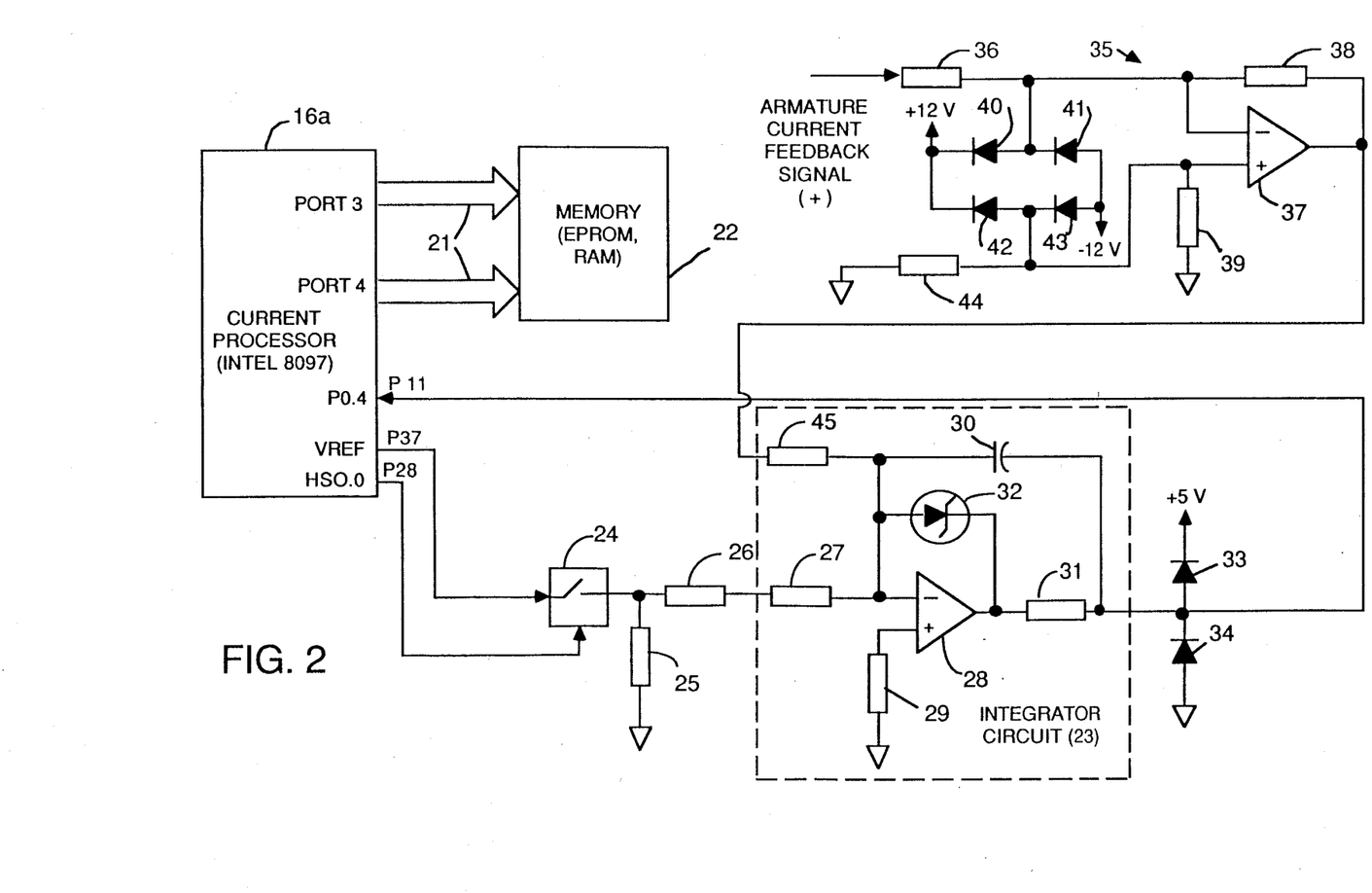
FIG. 2 is a schematic of a current processor portion of the control in FIG. 1 that incorporates the present invention.

FIG. 2 shows the details of the current processor portion 16 of the drive which are employed in carrying out the present invention. This includes a current processor 16a, which in this example is an Intel 8097 Microcontroller available from Intel Corporation, Santa Clara, Calif. This description will include certain salient details concerning employment of this microelectronic processing device in the particular circuit shown in FIG. 2, however, for full details concerning the architecture, operation and programming of this device, reference is made to the commercial literature available from Intel Corporation on this subject.

The current processor 16a is connected through Port 3 and Port 4 and through address and data buses 21 to memory 22 including EPROM (erasable programmable read only memory) circuits for storing a program of instructions to direct the operations of the current processor 16a and also including RAM (random access memory circuits) for storing data and temporary results generated during execution of the program. The current processor 16a is also connected through control lines (not shown) to control read and write operations and to activate the other circuitry controlled by it.

Three terminals on the processor 16a are of particular interest. Input terminal P0.4 (pin 11) in Port 0 is connected to the output of a charge sampling circuit in the form of an integrator circuit 23. An analog signal received at this terminal is applied to a 10-bit analog-to-digital converter included within the processor 16a. A voltage reference (VREF) terminal (pin 37) is connected through a solid state switch 24, a shunt resistor 25, and two series resistors 26, 27 to an inverting (−) input on an operational amplifier 28 which has been connected to operate as an integrator. The noninverting (+) input of the operational amplifier 28 is connected through a resistor 29 to a signal ground to provide a reference voltage of zero volts. The HSO.0 (high speed output 0) output terminal is an enable terminal for enabling the reset of the integrator circuit 23, and this terminal is connected to an enable input on the solid state switch 24. In the preferred embodiment two such switches are used in parallel to obtain lower resistance, however, they may be represented functionally by a single such switch 24.

A capacitor 30 has a positive plate connected to the inverting (−) input of the operational amplifier 28 and a negative plate connected to the output of the operational amplifier 28 through a resistor 31. In the preferred embodiment two such capacitors are connected in parallel to obtain the desired capacitance with lower cost, lower tolerance components, however, they may be represented functionally by a single such capacitor 30. A zener diode 32 with a breakdown threshold of +8.2 volts has an anode connected to the output of the operational amplifier 28 and a cathode connected to the inverting (−) input to limit the output voltage on the operational amplifier 28 to +8.2 volts, thereby preventing the operational amplifier 28 from being driven into saturation. The output of the integrator circuit 23 is somewhat lower due to the drop across the resistor 31 and the output point is clamped to a maximum of approximately +5.6 volts by a first diode 33 and is clamped to a minimum of approximately −0.6 volts by a second diode 34. This clamped output point is connected to input terminal P0.4 on the current processor 16a as explained earlier.

A positive voltage proportional to armature current is fed to a voltage clamp and inverter circuit 35 seen at the upper right corner of FIG. 2. The signal is applied through a positive side resistor 36 to the inverting (−) input of an operational amplifier 37 connected to operate as an inverter. In this configuration, a resistor 38 is connected across the inverting (−) input and the output of the operational amplifier 34. The noninverting (+) input is connected through another resistor 39 to a signal ground. The range of signals applied to the inputs of the operational amplifier 37 is limited by a bridge of four diodes 40, 41, 42 and 43 and resistor 44 which are connected to the inputs of the operational amplifier 37 and to +12-volt and −12-volt sources as shown. This limits the voltage at each input of the operational amplifier 37 to a range of approximately +12.6 volts to −12.6 volts.

The inverter circuit 37–39 inverts the positive voltage representing armature current to a negative voltage which is applied through resistor 45 to the inverting (−) input of the operational amplifier 28 which is also a summing point. This negative voltage is inverted by the integrator circuit 23 in the manner known in the art. If a constant DC voltage of −5 volts were applied in this manner the capacitor 30 across the operational amplifier 28 would charge and the output of the integrator circuit 23 would be a positively increasing ramp function of constant slope until the output of the op amp 28 reached the maximum of +8.2 volts. The capacitor 30 across the operational amplifier 28 can then be discharged (assuming no armature current feedback signal) by applying the positive reference voltage (VREF) through switch 24 for a suitable time to cause the capacitor 30 to discharge, and this causes the output voltage of the integrator circuit 23 to decrease to zero when the capacitor is completely discharged.

It is, however, a discovery related to the invention that it is not necessary to block the armature feedback signal during times when the integrator circuit 23 is being reset. The integrator circuit 23 accumulates charge on its capacitor 30 for a succeeding measurement cycle at the same time it is being discharged for a previous measurement cycle, provided that the discharge is equated to the charge accumulated on the previous measurement cycle.

The A-to-D converter in the current processor is a 10-bit device that counts from 1 to 1024 (decimal). The reference voltage (VREF) is supplied within the processor 16a to the A-to-D converter to scale the range of the converter to a maximum of +5 volts at a digital value of "1024". The digital value of the A-to-D conversion can therefore be expressed as follows:

$$\text{Digital Value} = V_{IN} \times 1024 / V_{REF}$$

where $V_{IN}$ is limited to a maximum of +5 volts ± some tolerance.

The use of the integrator circuit 23 is advantageous because it improves the resolution of the analog-to-digital conversion. For example, if a digital value, which represents the integral of current that is charging the capacitor, is read by the processor 16a, and a reset signal is equated to this value and applied to the integrator circuit 23, the capacitor 30 may not be fully discharged. This is due to the remainder or increment of charge that is smaller than the resolution of the A-to-D converter. However, this remainder or increment of charge will be included in the total charge on the capacitor 30 during the next sampling cycle. With this technique, the small remainders of charge will combine to produce an added value of one count in some sampling intervals, and the average of digital values over several sampling cycles will take these small increments of charge into account.

The sampling cycles for the integrator circuit 23 are determined and controlled by the current processor 16a under the direction of a program read from the EPROM portion of memory 22. The pertinent portion of this program is disclosed in Appendix A as a "Current Reference Module". This program module is presented in a high level language for microprocessors known as PL/M. With a suitable compiler, which is commercially available for this language and the Intel 8097 microprocessor, this program module can be compiled to object code. The conversion of the PL/M source code instructions to the assembly language for the Intel 8097 microprocessor, and the conversion of the assembly language instructions to a binary code of "1's" and "0's" is accomplished in a fashion that is transparent to the source code programmer.

The current processor 16a executes a "Current Reference Module" portion of the program to execute the current regulation loop shown in FIG. 1 and to control the time at which the SCR's are fired. As shown and described in Berkopec et al., U. S. Pat. No. 4,549,122, a suitable SCR bridge may include six pairs of SCR's. The SCR's are fired to convert three alternating current (AC) signals to direct current (DC) signals. The AC signals may be represented by sine waves in which each cycle has a positive half cycle and a negative half cycle. The three sine wave signals (Phase A, Phase B and Phase C) repeat 60 times each second (60 Hz) and when represented graphically are staggered in relation to each other (120° phase difference). Assuming, for example, that the motor is to be operated in the forward direction of rotation, the SCR bridge chops up the sine wave signals and converts all negative phase signals to positive value signals (rectification). To do this, the six pairs of SCR's are fired in sequence during the time period of one cycle of the AC signals from the power source 13. One pair of SCR's is fired for each phased sine wave signal (3 pairs total) during its positive half cycle and one pair of SCR's is fired for each phased sine wave signal (3 more pairs) during its negative half cycle. The SCR firings generate a series of pulses, all positive in this example, and the average value of these pulses is seen by the motor as a direct current (DC) voltage which produces a direct current in the armature 10. The SCR's can also be controlled to produce a DC voltage of negative polarity with respect to the terminals designated DC and −DC in FIG. 1.

During steady-state operation the six pairs of SCR's are fired in time intervals which are 1/6 of the time (60° apart in phase) for one cycle of the 60-Hz supply signal. When it is desired to increase the rate of firing to produce more current, these time intervals can be shortened or "phased back" to shorter time intervals representing a smaller phase difference (e.g. 45°).

Assuming the current command $I_{CMD}$ calls for current in the same direction as is currently being supplied to the motor, the Current Reference Module directs the current processor 16a to read and calculate current loop regulation values until there is insufficient time to complete another iteration before an SCR pair must be fired. The current processor 16a then fires the next SCR pair. The Current Reference Module also sets up a timed interrupt to recall itself in advance of the next firing. If, for example, the firing times were 60° apart in phase relative to the 60-Hz signal, the Current Reference Module would be re-entered at a time 30° in phase in advance of the next firing time. Until re-entry, a time—corresponding to 30° in phase in this example—is provided for execution of background routines in the program for the current processor 16a.

The firing time of each pair of SCR's should be based on a current reading from the integrator circuit 23 that is as "fresh" as possible. Therefore, after a current integral value is read from the integrator circuit 23 and a firing time is calculated, the current processor 16a will perform another sampling cycle if there is enough time before the firing time.

When the current integral is first read from the integrator circuit 23, the next firing time is checked. If there is not enough time to execute a reset of the integrator circuit 23, the program sets a SAT FLAG bit in memory 22, as a way of determining—on the next time through this particular part of the program—whether or not the integrator circuit 23 has been reset.

Figure 3:
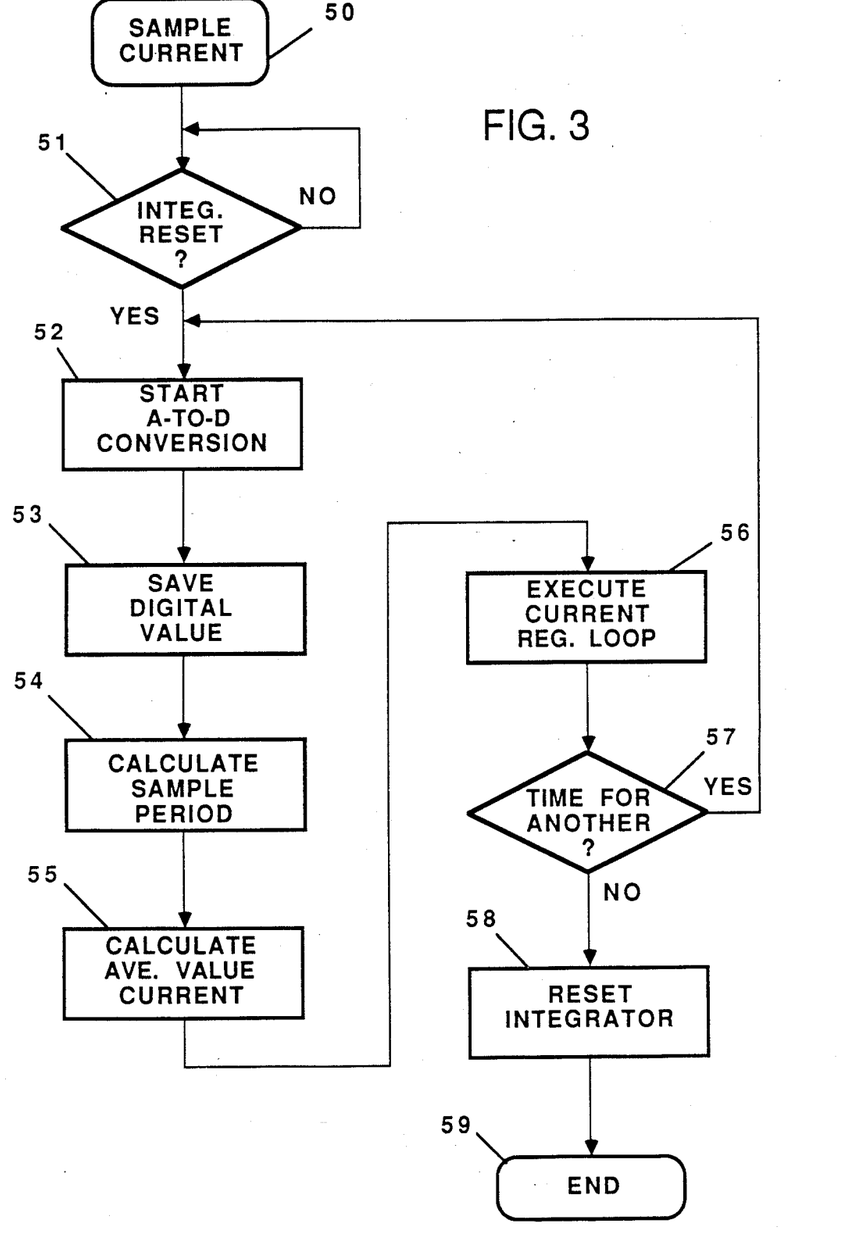
FIG. 3 is a flow chart illustrating the different steps carried by the current loop microprocessor.

The current sampling sequence is seen in Appendix A in the portion labeled "Sample current: ". Steps of the sequence which are significant to the invention are also shown in FIG. 3. After the start of the sample current sequence represented by start block 50 the current processor 16a determines whether or not the integrator circuit 23 has been reset from the previous cycle, as represented by decision block 51. If the integrator has not been reset, as represented by the "NO" result branch from decision block 51, the current processor 16a executes a wait loop by re-executing decision block 51. Assuming the integrator 23 has been reset, as represented by the "YES" result branch from decision block 51, an instruction is executed to start the A-to-D as represented by process block 52. Next the 10-bit digital value is separated from certain status information related to the A-to-D conversion and is saved as a signed value in a memory location referred to as "local tmp" as represented by process block 53.

Then a section of the program referred to as "Calculate phase:" is executed to calculate the average value of $I_{FB}$ by dividing the current integral value by a digital value for a sample period as represented by process block 55. The digital value for the sample period is calculated by subtracting a time for starting the A-to-D conversion ("sample time") from an earlier sample time that has been saved as the quantity "old time", as represented by process block 54. The "Calculate phase:" section also includes instructions which are executed to apply the gain $K_I$ of the current regulator Circuit 15 to the current error ($I_{ERROR}$) to develop the DC voltage to be obtained by firing the SCR's. The execution of this part of the current regulation loop is represented by process block 56. This DC voltage demand value is checked to determine whether a current loop limit has been reached, and thereafter the resulting voltage demand is converted to phase angle firing commands for the SCR's.

Next, the current processor 16a executes a "check end stop" portion of the Current Reference Module. The "end stop" is a period timed by a software timer during execution of the Current Reference Module. If for some reason the program does not cause the next pair of SCR's to be fired within this "end stop" period, the "end stop" timer will time out generate and an interrupt to cause the next pair of SCR's to be fired. Assuming there is sufficient time left before the "end stop" time-out, the current processor, 16a executes a "firing pulse" section of the Current Reference Module (not illustrated in FIG. 3) to set up an interrupt to re-enter the background portion (referred to as the foreground portion in Appendix A) of the program for the current processor 16a.

As stated earlier herein, the firing time of each pair of SCR's should be based on a current reading from the integrator circuit 23 that is as "fresh" as possible. Therefore, after a current integral value is read from the integrator circuit 23 and a firing time is calculated, the current processor 16a will perform another sampling cycle if there is enough time before the firing time, as represented by decision block 57.

Next, the current processor 16a executes a "reset integrator" section of the Current Reference Module to reset, the integrator circuit 23, as represented by process block 58. Instructions are executed to generate a logic low enable signal to the solid state switch 24 in FIG. 1 at a time referred to as "reset time". This is followed by execution of instructions to generate a logic high disable signal to the solid state switch 24 at a time calculated by adding the integral value that was read from the integrator circuit 23 to the reset time. Execution of these two groups of instructions applies the positive reference voltage (VREF) to the inverting input ($-$) of the op amp 28 to discharge the capacitor 30 by the amount of the integral value read from the output of the integrator circuit 23. While this is occurring, a negative voltage representing feedback current can still be received by the integrator circuit 23 through the current path through the resistor 45 to place additional charge on the capacitor 30 to be read in the next sampling period. After executing some miscellaneous functions seen in Appendix A, the current processor 16a then returns from the Current Reference Module to other programmed routines, as represented by terminal block 59.

The above description has covered the details of a preferred embodiment of the invention. It will be apparent to those skilled in the art that certain modifications might be made to the details of the above circuitry to arrive at other embodiments for carrying out the invention. Therefore, to apprise the public of the range of the embodiments coming within the scope of the invention the following claims are made.

APPENDIX A

```
$TT('Current Reference calc')
$ab  fast(100) pw(80) ro
$set (TEST_MODE_AVAILABLE)
$set (LOOP_CHECK)
/*******************************************************************
** CURREF.PLM    - Calculate firing angle for current command
**-----------------------------------------------------------------
** Copyright 1986 Allen Bradley Company (see notice in module PWRON.PLM)
**================================================================
**      AUTHOR: Miskin/Nelson
**================================================================
**
**      CALLING FORMAT  invoked by interrupt service routine
**
**      INPUTS:
**
```

```
**
**      OUTPUTS:
**
**
**      ERROR MESSAGES:
**
**      FUNCTIONAL DESCRIPTION:
**
**
**------------------------------------------------------------------------
**   PSEUDO-CODE:
**
**
*************************************************************************/

Current_Ref_Module:  DO;

$NOLIST
$ic (std.lit)
$ic (stdreg.ext)
$ic (iodef.lit)
$ic (fltcod.lit)
$ic (dpdef.lit)
$ic (osschd.ext)
$ic (spad.ext)
$ic (motsts.pub)
$ic (lsync.ext)
$ic (arctab.pub)
$ic (distab.pub)
$ic (utlprc.ext)
$LIST Dcl     sts             byte;
            Dcl     idisc_ptr       LIT 'tmp_int_1';
            Dcl     when_to_fire    LIT 'tmp_int_2';
            Dcl     load_time       LIT 'tmp_int_3';
            Dcl     end_stop_time   LIT 'tmp_int_3';

Dcl     zero_time       LIT 'tmp_int_4';
            Dcl     ad_check        LIT 'tmp_int_4';
            Dcl     volts_temp      LIT 'tmp_int_5';
            Dcl     change_bridges  LIT 'tmp_byt_1';
            Dcl     sat_flag        LIT 'tmp_byt_2';

Dcl     local_tmp       word fast;
            Dcl     temp_low        byte at (.local_tmp);
            Dcl     temp_high       byte at (.local_tmp + 1);
            Dcl     ctr             integer slow;
            Dcl     osc_in          integer slow;

current_ref$$:   PROCEDURE       byte    public;

End_stop_trap:
        if ( end_stop_status = PENDING ) then do;
                end_stop_status = PREVENTED;

int_mask = ( SOFT_TIME_INT_ON or int_mask );
                enable;

end_stop_time = 0;      /* waste time to allow ir */ if (end_stop_status = PREVENTED ) then
                return FLT_END_STOP;
        end;

/* Start new end-stop cycle */
        end_stop_status = FALSE;

enable;
```

```
message_scan:
$if test_mode_available
        /* for test only */
        if ( servo_check <> 0 ) then
                do;
                -servo_check = signed( unsign(servo_check) and 3);
                do case servo_check;
                /* 0 will not occur */
                      ;

/* 1 without analog */
                    osc_in = 0;

/* 2 with small analog */
                    sts = ad_convert$$(AD_TEMPERATURE_MONITOR, .osc_in);

/* 3 with big analog */
                    do;
                    sts = ad_convert$$(AD_TEMPERATURE_MONITOR, .osc_in);
                    osc_in = osc_in * 4;
                    end;
                end;

ctr = ctr + 1;
                if (ctr > test_cycles) then ctr = 1;
                if (ctr > up_cycles ) then
                        arm_i_cmd = level - trial + osc_in;
                else
                        arm_i_cmd = level + trial + osc_in;
                end;
        else
$endif
        call get_param$$;

/* wait until current-integrator is reset */
            if not bittst(.HSO_STATUS, HSO_INTEGRAL_RESET ) then
                /* if not wait until it is */
                do while
                    ( not bittst(.HSO_STATUS, HSO_INTEGRAL_RESET ) )
                    and
                    ( (end_stop_time - timer1) > UPDATE_CALCULATE  );
                    /* can not afford to wait after end-stop */
                    ;
                end;

/* force first regulation */
            Disable;
            when_to_fire = timer1 + UPDATE_CALCULATE + UPDATE_CALCULATE;

Do while ( when_to_fire - timer1 ) > UPDATE_CALCULATE;
Start_of_iteration:
/***************/
            enable;

$if loop_check
            ioport_2 = TEST_ON;
$endif

Sample_current:
            if bittst$$(.AD_STATUS,AD_GO) then
            /* Conversion in progress */
                return FLT_AD_BUSY;

/* Start conversion              */
            AD_CON=(AD_CURRENT_INTEGRAL or 8);

/* Do a few odds and ends while waiting*/
            sample_time = timer1;
```

```
            if not bittst(.HSO_STATUS, HSO_INTEGRAL_RESET ) then
            /* we want to read current again to get correct reset */
                sat_flag = TRUE;
            else
                sat_flag = FALSE;

/* set up conversion watchdog */
            ad_check = timer1 + ALLOWED_AD;

do while bittst$$(.AD_STATUS,AD_GO);
            /* Wait for conversion to finish */
                if (ad_check - timer1) < 1 then
                /* Over the top on time */
                    return FLT_AD_TIMEOUT;
            end;

temp_low  = AD_STATUS;
            temp_high = AD_RESULT;

/* Shift down to 10 bits           */
            local_tmp = shr$$( local_tmp,6 );
            current_integral = signed$$( local_tmp );
```

Calculate_phase:

```
/************* in Assembler/Code for efficiency. This is what it does *******/
/*          pi_arm is in assembler for efficiency                          */
/*          THIS IS WHAT IT DOES >>                                        */
/*                                                                         */
/*          Calculate mean current>                                        */
/*      mean_current= (current_integral*2^16) / (sample_time - old_time);  */
/*                                                                         */
/*          and limits-check it to 0FFFH>                                  */
/*      If (mean_current > 0FFFFH) then                                    */
/*          mean_current = 0FFFH;                                          */
/*      else                                                               */
/*          mean_current = mean_current/16;                                */
/*                                                                         */
/*      proportional_term = (ref_mag - mean_current) * KP;                 */
/*          Limits-check proportional-term                                 */
/*      If (proportional_term > 400H * 2^16) then                          */
/*          proportional_term = 400H * 2^16;                               */
/*      proportional_term can not be less than -400h, so no check          */
/*      proportional_term = proportional_term * 2^4 / 2^16                 */
/*                                                                         */
/*      volts_demand = integral_term + proportional_term                   */
/*          Limits check volts_demand>                                     */
/*      if     (volts_demand > ALPHA_LIMIT)                                */
/*      then do;                                                           */
/*          volts_demand = ALPHA_LIMIT                                     */
/*          loop_status = loop_status or EXCESS_MOTOR                      */
/*      end;                                                               */
/*      else if (volts_demand <  BETA_LIMIT)                               */
/*      then do;                                                           */
/*          volts_demand = BETA_LIMIT;                                     */
/*          loop_status = loop_status or EXCESS_REGEN                      */
/*      end;                                                               */
/*      else                                                               */
/*          loop_status = loop_status and NO_EXCESS                        */
/*                                                                         */
/*      Do arc-cos adaption                                                */
/*      if (volts_demand > 0 ) then                                        */
/*          phase_demand = adapt_angle+ARC_LOOK_UP( volts_demand);         */
/*      else                                                               */
/*          phase_demand = adapt_angle-ARC_LOOK_UP(-volts_demand)          */
/*                       + PHASE_90 * 2 ;                                  */
/*                                                                         */
/*          Do phase to time conversion>                                   */
/*      return (sync_org + multpl$$(count_360,phase_demand,3)              */
/***************************************************************************/
```

```
                        when_to_fire = pi_armss;

Check_end_stop:
                if ( (end_stop_time - timer1) < count_30 ) then
                if ( end_stop_status = FALSE ) then
                        do;
                        /* Set up an end-stop */
                        disable;
                        if bittst(.HSO_STATUS, CAM_FULL ) then
                            return FLT_CAM_FULL;

hso_con = ( SOFT_TIMER_ONE or HSO_INTERRUPT );

if (end_stop_time - timer1) < HSO_MARGIN then
                            hso_time = timer1 + HSO_MARGIN;
                        else
                            hso_time = end_stop_time;

end_stop_status = PENDING;
                        int_mask = ( int_mask or soft_time_int_on );

enable;
                        end;

if end_stop_status = activated then
                        when_to_fire = timer1;

$if loop_check
                ioport_2 = TEST_OFF;
$endif

End;

end_of_iteration:
/**************/ end;
                /* of no_bridge_switch */ firing_pulse:
$if loop_check
        ioport_2 = TEST_ON;
$endif

Disable;

if ( bittst$$(.hso_status, CAM_FULL) )      /* room in CAM file? */
        then
                return FLT_CAM_FULL;

if ( (when_to_fire-timer1) < HSO_MARGIN  )/* is enough time? */
        then
                when_to_fire = timer1 + HSO_MARGIN;

hso_con  = (HSO_OUT_ON OR HSO_ARM_FIRE);/* load firing */
        hso_time = when_to_fire;
        fire_at  = when_to_fire;

hso_con = (HSO_OUT_OFF OR HSO_ARM_FIRE or HSO_INTERRUPT);
        hso_time = fire_at + count_30;

$if loop_check
        ioport_2 = TEST_OFF;
$endif forgnd_interrupt = ON;   /* Flag interrupt loaded */
```

```
            enable;

reset_integrator:
        /* Was current integrator reset */
        if sat_flag then do;
                do while not (bittst$$(.hso_status, HSO_INTEGRAL_RESET));
                        if (timer1 - reset_time ) > count_60 then
                                        return FLT_INTEG_RESET;
                end;

sample_time = timer1;

sts = ad_convert$$(ad_current_integral, .current_integral);
                if (sts <> FLT_OK)
                then
                        return sts;

end;

disable;
                        /* Do the reset */
        if ( bittst$$(.hso_status, CAM_FULL) )    /* room in CAM file? */
        then
                return FLT_CAM_FULL;

reset_time = timer1 + HSO_MARGIN;

hso_con = (HSO_OUT_OFF OR HSO_INTEGRAL_RESET);
        hso_time = reset_time;

load_time = reset_time + current_integral;

hso_con = (HSO_OUT_ON OR HSO_INTEGRAL_RESET);
        hso_time = load_time;

enable;

Tidy_up:
        /* Read AD input*/
        sts = ad_convert$$(ad_volt_fil, .volts_temp);   /*filtered*/
        if (sts <> FLT_OK)
        then
                return sts;

/* and make signed */
        volts_temp = volts_temp - 200h;

/* Convert to physical units */
        arm_volts = multpl$$( volts_temp, k_arm_volt, 7);

/* Work out integral for this scan */
        /* Used in the next */

/* if armature off
                        or
        if Estop button pressed
                        then
                match bemf */
        if ( not (BITTST$$(.IOPORT_2,IP2_ESTOP_OFF)) ) or
           ( not (BITTST$$(.loop_cmd,ARM_ON          )) )

then do;
                if (bridge_select)
                then
                        integral_term = multpl$$(volts_temp,k_bemf,6);
                else
                        integral_term = -multpl$$(volts_temp,k_bemf,6);
        end;
```

```
        else
                    /* Do integral update */
                    CALL int_add$$;

/* Limits check */
        if (integral_term > ALPHA_LIMIT)
        then
                integral_term = ALPHA_LIMIT;
        else
                    if (integral_term < BETA_LIMIT)
                    then
                            integral_term = BETA_LIMIT;

/* Set up for next scan */
        old_time = sample_time;

/* Make current-feedback signed */
        if (not bridge_select) then
                    mean_current = -mean_current;

/* setup next task in background */
        task_status_tbl(TSK_NEW_PULSE) = ON;
        return FLT_OK;

END current_ref$$;
    END Current_REF_Module;
```

I claim:

1. A method of sensing current being supplied to an electrical device, the method comprising:
   (a) generating a feedback signal proportional to the current being supplied to the electrical device, wherein the feedback signal is allowed to vary according to the magnitude of current being supplied to the electrical device;
   (b) feeding the feedback signal to an integrator circuit that generates an analog output signal which is the integral of the feedback signal over a sample time period;
   (c) sensing the analog output signal for the sample time interval and converting it to a first digital value, wherein the analog output signal and the first digital value will vary according to the magnitude of current being supplied to the electrical device;
   (d) calculating an average value of current supplied to the electrical device by dividing the first digital value by a second digital value for the sample time period;
   (e) resetting the integrator circuit in response to the first digital value by generating a reset signal to the integrator circuit that is proportional to the first digital value, and by generating the reset signal for a time period necessary to discharge the integrator circuit by an equal amount to which it was charged to generate the analog output signal; and
   (f) repeating steps (c)-(e), thereby sensing a fraction of the analog output signal that is not sensed during a first cycle of steps (c)-(e) due to the resolution of the conversion of the analog output signal to a digital value.

2. The method of claim 1, wherein the feedback signal is fed to the integrator circuit during a time in which the integrator circuit is being reset by the reset signal.

3. The method of claim 1, further comprising the step of limiting the output of the integrator circuit to prevent its saturation.

4. The method of claim 1 in which the feedback signal that is fed to the integrator circuit has a negative polarity and in which the reset signal has a positive polarity.

5. The method of claim 1, wherein steps (c)-(e) are carried out with a microelectronic processing means by reading and executing a program stored in memory.

6. The method of claim 1 wherein the electrical device is an electrical motor.

7. The method of claim 6 in which steps (c)-(e) are carried out in a time period between firings of SCR circuitry in a DC motor control.

8. A circuit for sensing the actual value of current being supplied to an electrical device, the circuit comprising:
   an integrator circuit having input means for receiving a feedback signal that is proportional to the current being supplied to the electrical device, wherein the feedback signal is allowed to vary according to the magnitude of current being supplied to the electrical device, and wherein the integrator circuit also has an output;
   means for sensing an analog signal at the output of the integrator circuit and converting it to a first digital current value, wherein the analog output signal and the first digital current value vary according to the magnitude of current being supplied to the electrical device;
   means responsive to the conversion of the analog signal to the first digital current value for calculating the average value of the current supplied to the electrical device by dividing the first digital current value by a second digital value for the sampling time period;
   means responsive to the first digital current value for controlling the resetting of the integrator circuit by controlling application of a reset signal to the input means of the integrator circuit for a time period necessary to discharge the integrator circuit by an equal amount to which it was charged to generate the analog signal; and means for operating the means for sensing, the means for calculating and the means for controlling, for successive cycles, thereby sensing a fraction of the analog output signal that is not sensed during a first cycle due to the resolution of the conversion of the analog output signal to the first digital current value.

9. The circuit of claim 8, wherein the input of the integrator circuit is a summing input at which the reset signal is summed with the feedback signal to allow integration of the feedback signal during reset of the integrator circuit.

10. The circuit of claim 8, in which the means for sensing, in which the means for calculating, in which the means for controlling and in which the means for operating the means for sensing, the means for calculating and the means for controlling for successive cycles, are incorporated in a microelectronic processor.

11. The circuit of claim 8 in which the integrator circuit includes means for limiting the output to prevent saturation of the integrator circuit.

12. The circuit of claim 8 wherein the input means includes means for receiving a feedback signal having a negative polarity and wherein the means for controlling application of the reset signal includes means for causing the generation of the reset signal with a positive polarity.

13. The circuit of claim 8 wherein the electrical device is an electrical motor.

14. The circuit of claim 8 wherein the means for operating for successive cycles includes means for operating the means for sensing, the means for calculating and the means for controlling, within a time period between firings of SCR circuitry in a DC motor control.

* * * * *

UNITED STATES PATENT AND TRADEMARK OFFICE
CERTIFICATE OF CORRECTION

PATENT NO. : 4,804,895
DATED : Feb. 14, 1989
INVENTOR(S) : John D. Miskin

It is certified that error appears in the above—identified patent and that said Letters Patent is hereby corrected as shown below:

Column 6, line 26   Add "+" sign before first DC

Column 7, line 10   after "A-to-D" add -- conversion, --.

Column 7, line 41   "generate and" should be --and generates --

Column 8, line 16   After "reset" delete the comma

Signed and Sealed this

Ninth Day of January, 1990

Attest:

JEFFREY M. SAMUELS

Attesting Officer

Acting Commissioner of Patents and Trademarks